(12) United States Patent
Song

(10) Patent No.: US 6,778,303 B2
(45) Date of Patent: Aug. 17, 2004

(54) N-VALUED OPTICAL LOGIC ARCHITECTURE AND METHOD

(75) Inventor: Shaowen Song, 704 Brandenburg Boulevard, Waterloo (CA), N2T 2V4

(73) Assignee: Shaowen Song, Waterloo (CA)

( * ) Notice: Subject to any disclaimer, the term of this patent is extended or adjusted under 35 U.S.C. 154(b) by 0 days.

(21) Appl. No.: 09/860,431

(22) Filed: May 21, 2001

(65) Prior Publication Data

US 2002/0001112 A1 Jan. 3, 2002

Related U.S. Application Data

(60) Provisional application No. 60/205,561, filed on May 22, 2000, and provisional application No. 60/291,983, filed on May 21, 2001.

(51) Int. Cl.[7] ............................................. G02F 3/00
(52) U.S. Cl. ..................................... 359/108; 359/107
(58) Field of Search ............................... 359/107, 108, 359/333, 341.1, 344, 349

(56) References Cited

U.S. PATENT DOCUMENTS

| | | | |
|---|---|---|---|
| 4,504,846 A | 3/1985 | Chappell et al. | 257/29 |
| 5,339,201 A | 8/1994 | Nishimura et al. | 359/891 |
| 5,757,525 A * | 5/1998 | Rao et al. | 359/108 |
| 5,926,282 A | 7/1999 | Knobloch et al. | 356/419 |

FOREIGN PATENT DOCUMENTS

| WO | WO 98/20376 | 5/1998 |
|---|---|---|
| WO | WO 00/04669 | 1/2000 |

OTHER PUBLICATIONS

K. Vahala, R. Paiella, G. Hunziker, "All–Optical Wavelength Coded Logic Gates", May, 14, 1998, WO 98/20376.*

Choo et al., "Multiwavelength optical content–addressable parallel processor for high–speed parallel relational database processing", Applied Optics, vol. 38, No. 26, pp. 5594–5604, Sep. 10, 1999.

Poustie et al., "All–optical regenerative memory with full write/read capability", Optics Communications 154, pp. 277–281, Elsevier Science B.V., Sep. 15, 1998.

* cited by examiner

Primary Examiner—Thong Nguyen
Assistant Examiner—Arnel C. Lavarias

(57) ABSTRACT

An architecture for optical logic gates is presented in which N predetermined wavelengths of light are used to define data. This data is manipulated by N-valued optical logic gates based on a set of rules referred to as Song's switching algebra. The gates when connected end to end to produce optical circuits such as optical random access memory or an optical arithmetic logic unit.

10 Claims, 5 Drawing Sheets

N-VALUED OPTICAL LOGIC ARCHITECTURE AND METHOD

This application is a non-provisional application of U.S. Provisional Application Ser. No. 60/205,561, filed May 22, 2000, and 60/291,983, filed May 21, 2001.

FIELD OF THE INVENTION

This invention relates to optical logic and more particularly, to optical computing using N wavelengths to represent N values.

BACKGROUND OF THE INVENTION

The development of the electronic computer was simplified tremendously by the standardization of the parts used to build it. As those parts became smaller they could be packaged together producing even smaller devices with increased functionality operating faster than their predecessors. Boolean logic gates form the basic building blocks of the electronic digital computer. The use of Boolean logic is appropriate in this application because it is difficult to move complicated data on a signal voltage line. The analog electric computer, which held data as analog voltage signals, was not successful because noise in the voltage signals corrupts the data. In the analog computer's favor is the amount of information that is transmitted on one signal. An analog computer would have been very fast compared to the binary computer at that time.

Fiber optic cable is now the standard means of transmitting information over long distances mainly because it does not suffer from crosstalk, dispersion can be compensated for and information being moved optically can be multiplexed in the wavelength domain. Wavelength division multiplexing (WDM) allows signals transmitted at different wavelengths (or colors) to be transmitted simultaneously down one optical fiber and operated on independently. Consequently, one optical fiber can carry significantly more information than a metal wire based on today's technology.

This advantage has been exploited by long distance bandwidth providers but it has not gained acceptance for optical computing applications. The concept of optical logic gates has been presented in U.S. Pat. No. 5,999,283. The patent describes a method of producing optical logic gates. The gates presented combine semiconductor optical amplifiers (SOA) and Mach Zehnder interferometers (MZI). The components it presents are based on Boolean logic which does not take advantage of wavelength division multiplexing.

In U.S. Pat. No. 4,262,992 a general design is presented that allows many different optical logic gates to share their footprint on the same substrate. This device also uses an interferometer producing constructive and destructive interference but in this case the interference is controlled with electrodes making it possible to reconfigure the substrate as required.

In Choo, Detofsky and Louri, Sep. 10, 1999, Applied Optics, Volume 38, Number 26, p 5594 to 5604, an optical processor is presented in which WDM and polarization effects are both used to enhance processing. This system is limited to using bulk optics, which limit the size and therefore complexity of the system. A two dimensional pixilated grid is used to polarization encode the data and wavelength is used to differentiate between different sets of data. Data is manipulated with logic gates that use polarization to attenuate the signal. This architecture cannot be used with fiber optic waveguides at this time due to the difficulty of integrating small polarization controlling components in the waveguides.

The field of optical computing is still developing and will likely see applications in smaller scale data networks. One current approach to smaller scale networks uses a configurable network architecture where destinations on the network are wavelength specific and the sources are tunable. This allows any source to selectively send information to any location in the network provided that only one source tries to send data to one receiver at one time. This network architecture is also limited in that the signals are not separated by wavelength until they reach their destination. Therefore, as the device is proposed in STARNET: A Multi-gigabit-per-second Optical LAN Utilizing a Passive WDM Star, Kazovsky, Poggiolini, Journal of Lightwave Technology, Vol. 11, No. 5/6 1993, p 1009–1027, every receiver can see all of the information. The individual receivers must be tuned to read only the information that is intended for them. Also, the signals are attenuated when they pass through the star coupler.

OBJECT OF THE INVENTION

In order to overcome these and other limitations of the prior art, it is an object of the invention to provide an optical digital logic architecture that utilizes the wavelengths of light to perform data representation and manipulation. This architecture is referred to as the N-valued optical digital logic system. It has applications in optical data storage and optical computing.

SUMMARY OF THE INVENTION

This invention relates to optical communication, data storage, and optical computing. It describes a means of processing and encoding data in the optical domain. As an optical communications design invention it describes an architecture supporting N wavelengths of light representing digital data in an N-valued logic system comprising:

a plurality of optical components, each component having an input port and an output port and for operating on a light signal received at the input port in accordance with a transfer function from a plurality of predetermined transfer functions. The light within the signal at a predetermined wavelength of the N wavelengths corresponds to a predetermined value among the N values and wherein N is at least 2.

In the proposed N-valued optical digital logic system, these transfer functions are applied in the optical domain. Since the input signals and output signals are both optical signals, the output signal of a first gate can be used as an input signal to a second gate.

Additionally, the architecture supports two wavelengths, wherein a first wavelength corresponds to a "0" and a second other wavelength corresponds to a "1". It then uses a binary interface to convert the N wavelength optical signal into an intensity encoded optical signal having two intensity levels representative of a 1 and a 0, respectively.

The optical logic gate transfer functions are given below. These gates can be combined to produce optical circuits. Alternatively, these gates can be used for simpler optical applications.

The invention also allows the use of multiple wavelengths to store data. That is, the data is stored in an appropriate medium in which one wavelength returns when a source hits it. Since a variety of wavelengths can be returned the presence of the one returned wavelength indicates the value of the data.

In accordance with another embodiment of the invention there is provided an optical logic system having N symbols wherein each symbol is represented by a wavelength of light comprising:

a. an optical component including:
b. a first port for receiving a first optical signal at any of the N wavelengths representative of the N symbols;
c. an output port; and
d. an optical circuit for receiving the first optical signal at any of the N wavelengths, for varying the first optical signal in accordance with a predetermined transfer function and for providing the second optical signal representative of one of the N symbols to the output port, the predetermined transfer function a same function for each of the N wavelengths.

DETAILED DESCRIPTION OF THE INVENTION

The invention relates to an architecture for use in designing optical digital devices including an optical computer in which all logical operations are accomplished in the optical domain with predetermined wavelengths corresponding to predetermined values. The architecture relies on a logic structure different from Boolean logic. The logic structure supports an N-ary logic system and is compatible with transfer functions obtainable using presently available optical components.

The proposed architecture takes advantage of improved technology in fiber optics that allows the information to be encoded by wavelength and/or by intensity. Currently, fiber optic networks can use 40 wavelengths or more. In it's simplest form, an optical computer might use 2 wavelengths or channels to represent "0" and "1" in which only one wavelength is present at a time. Alternatively, more wavelengths are used increasing the amount of information that is wavelength encoded. For example, if 40 discrete wavelengths are used then information is represented by the combinations of the 40-values from 0 to 39 with each of the 40 wavelengths.

The proposed architecture allows the data to be encoded in the intensity domain and logic operations in the wavelength domain, which forms a two-dimensional data representation and manipulation system.

Figure 1:
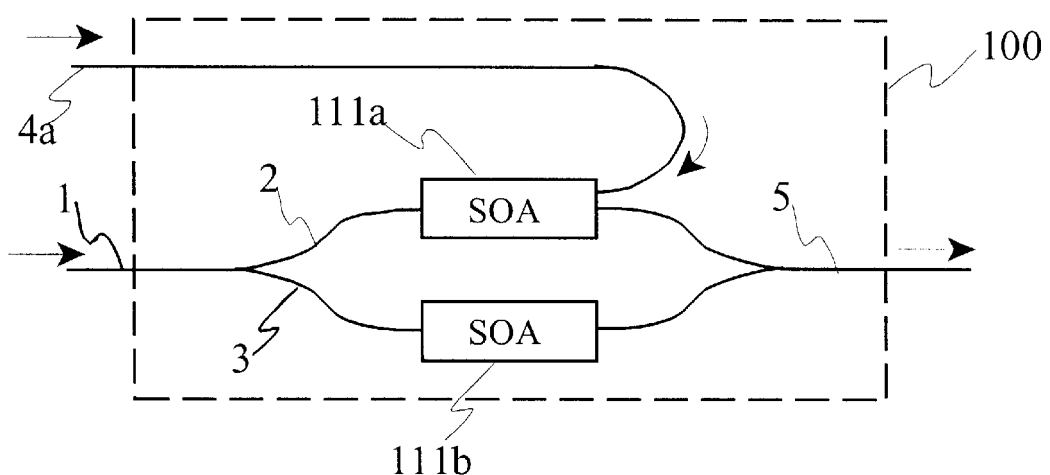
FIG. 1 is a schematic diagram of a Mach Zehnder Interferometer as is known in the art.

In a proposed embodiment the architecture is implemented using Mach Zender interferometers (MZI) and semiconductor optical amplifiers (SOA). The MZI when combined with SOAs produce a component that can be used as a logic gate. Referring to FIG. 1, the MZI 100 and SOAs 111a and 111b work as follows: light enters the MZI 100 through the input port 1 and is split equally. The two beams of light propagate through waveguides 2 and 3 respectively and each enters different SOAs 111a and 111b. The SOAs 111a and 111b are capable of introducing a phase shift on the beams. When a second optical signal is presented at the input port 4a, it triggers SOA 111a. When SOA 111a is triggered, a phase shift is not induced in light from the corresponding waveguide 2. When no light is presented to the input port 4a, then a phase shift is induced in the light signal from waveguide 2. The two beams are then recombined and exit the MZI 100 through the output port 5. If one of the beams is phase shifted 180° relative to the other beam then a destructive interference condition results. The destructive interference condition causes no light to appear at the output waveguide 5. When there is no phase difference between the two beams, for example if neither beam has an induced phase shift, then the two beams add constructively resulting in a light signal propagating at output port 5.

Figure 2:
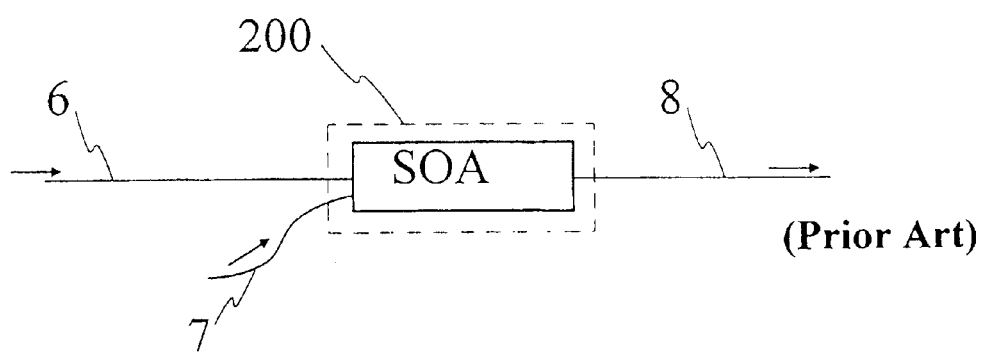
FIG. 2 is a schematic diagram of a semiconductor optical amplifier as is known in the art.

As shown herein, when an SOA is shown alone it does not behave the way it does when integrated within the MZI 100. Referring to FIG. 2, a continuous light signal enters the SOA 200 via input port 6. When a second light signal is provided via input port 7 the first signal looses energy and is attenuated. When the second light signal provided via input port 7 has minimal intensity, the first optical signal is nominally attenuated and exits the SOA 200 via output port 8.

Figure 3:
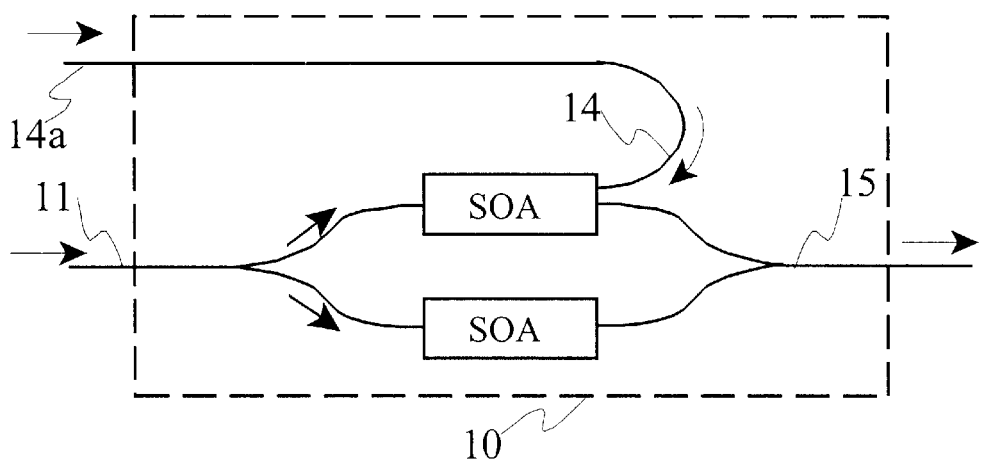
FIG. 3 is a schematic diagram of an O-AND optical logic gate.

Referring to FIG. 3, an O-AND optical logic gate is shown for producing the transfer function given in Table 1.1. There are numerous ways of achieving this transfer function in an all optical device. FIG. 3 shows a simple embodiment using an MZI with two SOAs. This device corresponds to the MZI 100 previously described. This gate 10 has two input ports 11 and 14a and one output port 15. A first optical logic signal X enters the MZI at the first input port 11. It will exit the MZI 10 through the output port 15 provided that a second input signal Y having a predetermined value is present at the second input port 14a entering the SOA. Within a broad range, the wavelength of the signal entering the SOA through input port 14 does not affect the operation of the device. When an optical signal exits the gate at the output port 15 it will have the same wavelength as the signal at the first input port 11, although it has been modulated by light entering at the second input port 14.

TABLE 1.1

O-AND N-valued Logic Gate Output

| X<br>Input Port 11 | Y<br>Input Port 14 | X O-AND Y<br>Output Port 15 | Y O-AND X |
|---|---|---|---|
| O | O | O | O |
| O | Y | O | O |
| X | O | O | O |
| X | Y | X | Y |

Figure 4:
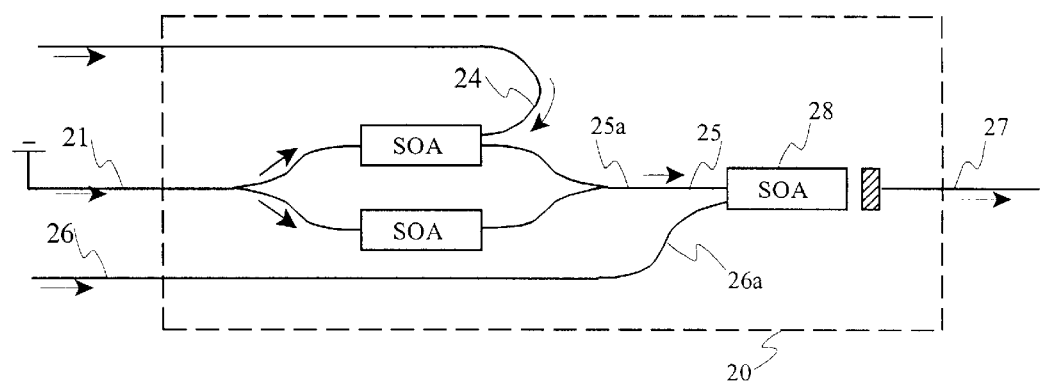
FIG. 4 is a schematic diagram of an O-OR optical logic gate.

Referring to FIG. 4, an O-OR gate 20 is shown for providing a transfer function in accordance with Table 1.2. This gate is implemented in any of a variety of different ways. The O-OR gate 20 relies on a continuous input signal provided at input port 21. The continuous input signal is at a known wavelength that is the same wavelength as a wavelength of a signal provided to input port 26. Light entering port 24 modulates the continuous signal within the device producing an output signal at the output port of the MZI 25a. This output port 25a is connected to the input port 25 of the SOA 28. When a light signal is present on the other input port 26a to the SOA 28 then the output signal is substantially attenuated. When light below a predetermined intensity enters the second input port 26a then light entering from the input port 25a propagates to the output port 27 with nominal attenuation.

TABLE 1.2

O-OR N-valued Logic Gate Output

| X Input Port 26 | Y Input Port 24 | X O-OR Y Output Port 27 | Y O-OR X |
|---|---|---|---|
| ○ | ○ | ○ | ○ |
| ○ | Y | X | ○ |
| X | ○ | ○ | Y |
| X | Y | ○ | ○ |

Figure 5:
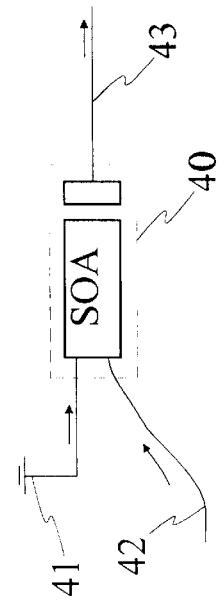
FIG. 5 is a schematic diagram of an O-NOR optical logic gate.

Referring to FIG. 5, an O-NOR gate 30 operates on light signals based on a transfer function given in Table 1.3. This gate is implemented in any of a variety of different ways. The O-NOR gate shown is formed with a single SOA 30. An optical signal is provided at first input port 31. When an optical signal having sufficient intensity is presented at a second input port 32 of the SOA 30 then light from the first input port 31 is substantially attenuated prior to exiting at the output port 33. When there is no signal of sufficient intensity at the second input port 32 then the optical signal entering the SOA from the first input port 31 exits the SOA at the output port 33 with minimal attenuation.

TABLE 1.3

O-NOR N-valued Logic Gate Output

| X Input Port 32 | Y Input Port 31 | X O-NOR Y Output Port 33 | Y O-NOR X |
|---|---|---|---|
| ○ | ○ | ○ | ○ |
| ○ | Y | Y | ○ |
| X | ○ | ○ | X |
| X | Y | ○ | ○ |

Figure 6:
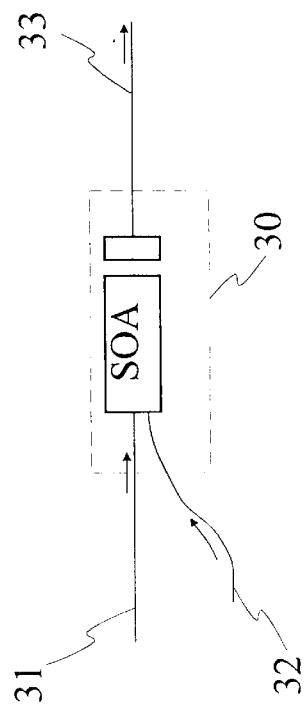
FIG. 6 is a schematic diagram of an O-NOT optical logic gate.

Referring to FIG. 6, an O-NOT gate 40 operates on light signals based on a transfer function given in Table 1.4. This gate is implemented in any of a variety of different ways. The O-NOT gate shown is formed with a single SOA 40. A continuous signal is provided at first input port 41. When an optical signal having sufficient intensity is presented at a second input port 42 of the SOA 40 then light from the input port 41 is substantially attenuated prior to exiting at the output port 43. When there is no signal of sufficient intensity at the second input port 42 then the optical signal entering the SOA from the first input port 41 exits the SOA at the output port 43 with minimal attenuation.

TABLE 1.4

O-NOT N-valued Logic Gate Output

| X | O-NOT X |
|---|---|
| ○ | X |
| X | ○ |

Figure 7:
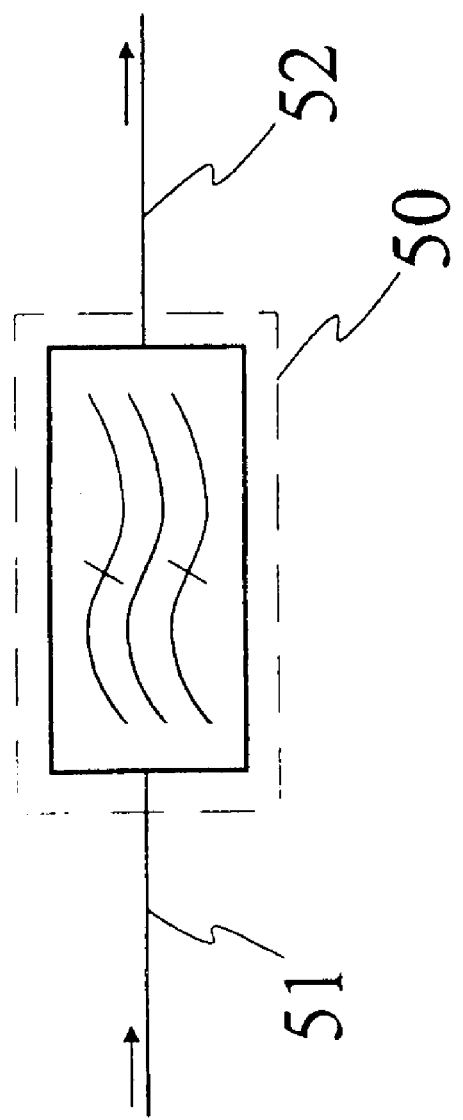
FIG. 7 is a schematic diagram of a prior art bandpass filter as is known in the art; and, FIG. 8 is a schematic diagram of an O-NAND optical logic gate.

Referring to FIG. 7, a bandpass filter 50 operates on light signals based on a transfer function given in table 1.5. It is a common component used in various DWDM applications and is known to those skilled in the art. An optical signal entering the input port 51 will be allowed to exit the bandpass filter at the output port 52 if and only if the wavelength of the input signal corresponds to the predetermined wavelength.

TABLE 1.5

Bandpass Filter Output

| Wavelength | X | Bandpass λ 1 (X) |
|---|---|---|
| 0–λ 1 | X | ○ |
| λ 1–λ 2 | X | X |
| λ 2 and above | X | ○ |

Figure 8:
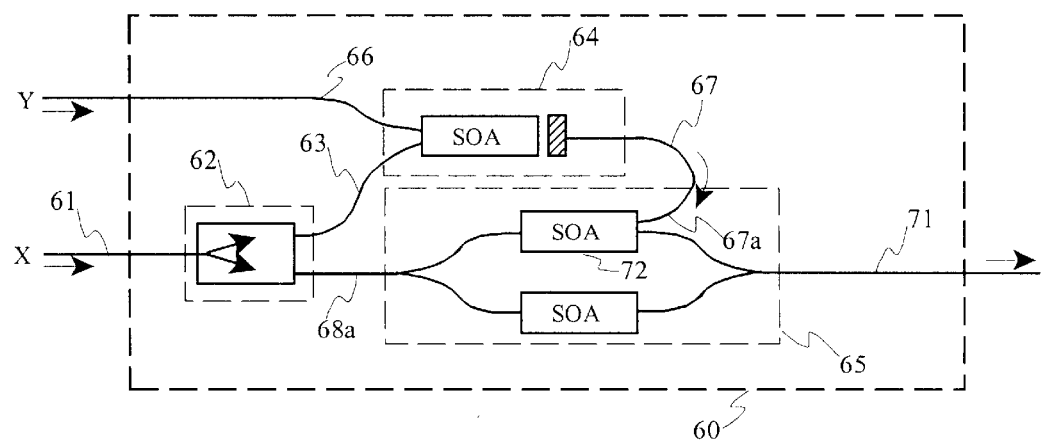

Referring to FIG. 8, an O-NAND gate 60 operates on light signals based on a transfer function given in Table 1.6. This gate is implemented in any of a variety of different ways. A first optical signal X is provided at first input port 61. This optical signal is split into two separate optical signals with a coupler 62. The coupler causes some of the first input signal to enter a first input port 63 of the SOA 64. The remainder of the optical signal enters the first input port 68a of the MZI 65. When a second optical signal Y having sufficient intensity is presented at a second input port 66 of the SOA 64 then light from the first input port 63 is substantially attenuated prior to exiting at the output port 67. When there is no signal of sufficient intensity at the second input port 66 then the optical signal entering the SOA from the first input port 63 exits the SOA at the output port 67 with minimal attenuation. The optical signal at input port 68a will exit the MZI 65 through the output port 71 provided that a second input signal is present at the second input port 67a entering the SOA 72. Within a broad range, the wavelength of the signal entering the SOA through input port 67a does not affect the operation of the device. When light exits the gate at the output port 71 it will have the same wavelength as the signal at the first input port 61.

TABLE 1.6

O-NAND N-valued Logic Gate Output

| X Input Port 61 | Y Input Port 66 | X O-NAND Y Output Port 71 | Y O-NAND X |
|---|---|---|---|
| ○ | ○ | ○ | ○ |
| ○ | Y | ○ | Y |
| X | ○ | X | ○ |
| X | Y | ○ | ○ |

As basic optical logic elements the gates can be combined to produce different digital optical circuits. Conceptually, this is analogous to the use of Boolean logic gates to represent the operation of a digital electrical circuit. However, they are not equivalent because the optical logic gates work with various wavelengths and the Boolean electrical logic gates work with only two states ("on" or "off"). The optical logic gates have been given names that that are consistent with Boolean logic gates. An "O" has been added as a prefix to the gate's name to distinguish these optical logic gates from the Boolean gates. These gates can be combined to produce optical circuits whose function is analogous to similar electrical circuits.

The analogous electrical circuits to these circuits provide the architecture used to design electrical binary computers. The N-valued logic circuits provide the architecture used to design an N-valued based computer and other N-valued optical digital devices. The proposed implementation of the N-valued digital system uses optical signals with different wavelengths to represent different data values however an N-valued computer need not be optical. Quantum states, for example, can be used to implement the current N-valued digital system.

The design of a complex N-valued device based on the proposed architecture requires a means of describing the mathematical operations algebraically. The algebra is based on a structure which is defined such that (W, +, −, ", ', 0) with two binary operators + and −, two unary operators ", and ', and one distinguishing element 0 and a set W along with a set of postulates. The postulates include closure, commutative laws, associative laws, distributive laws, identities, subset complements, global complements and conversion. The set W contains N elements where N can be any whole number. We denote W={$C_0, C_1, C_2 \ldots C_N$} with $C_0, C_1, C_2 \ldots C_N \in$ W.

The closure postulate states that set W is closed with respect to the unary operators " and ' and binary operators + and −.

The commutative laws state that for all a, b ∈ W, $$a+b \neq b+a \text{ but } a+b=a+(b+a)$$

$$a-b \neq b-a \text{ but } a-b=(a+b)-b=a-(a-b)$$

The associative laws state that:

$$a+(b+c)=(a+b)+c$$

$$a-(b+c)=(a-b)+c$$

The distributive laws state that:

$$a+(b-c)=(a+b)-(a+c)$$

$$a-(b+c)=(a-b)+(a-c)$$

$$(a-b)+c=(a+c)-(b+c)$$

$$(a+b)+c=(a+c)+(b+c)$$

$$a-(b-c)=(a-b)-(a-c)$$

The identity postulate states that the distinctive element 0 ∈ W is an identity element with respect to binary operators + and − for every a ∈ W such that, $$0+a=0$$

$$a+0=0$$

$$a-0=0$$

$$0-a=c \text{ where } c \in W$$

Also, $$a+a=0$$

$$a-a=0$$

The subset complement postulate states that for any element in a two element subset w ∈ W with W={0, a} there corresponds an element of a' with w such that $$a'=0$$

$$0'=a$$

The complement or global complement postulate states that for any element a in W there corresponds an element a" in W such that $$a''=0$$

$$0''=C, C \text{ is any element in } W$$

The conversion postulate states that for any element a ∈ W there is a conversion such that $$a \rightarrow b, \ b \in W$$

While it is known that N-valued logic, also referred to as switching algebra, is not unique, numerous other embodiments may be envisaged without departing from the spirit and scope of the invention.

What is claimed is:

1. An N-nary digital photonic (NDP) system that is also referred to as an N-nary digital photonic architecture that uses N wavelengths of light to represent and process digital data according to an N-valued digital logic system comprising:

a family of N-nary optical gates, each gate having a function of switching one wavelength among the N wavelengths from a signal input port of each gate to an output port of each gate in accordance with an N-nary transfer function defined by the N-valued digital logic;

wherein light within a signal at a predetermined wavelength of the N wavelengths corresponds to a predetermined value among the N values of the N-nary logic and wherein N-nary refers to N numbers of variables being involved in the system and wherein N is at least 2.

2. An architecture according to claim 1, wherein the input and output signals of the N-nary logic gates are in the optical domain.

3. An architecture according to claim 2, in which multiple N-nary logic gates are connected by waveguides to form N-nary optical logic circuits.

4. An architecture according to claim 2, wherein N=2, wherein a first wavelength corresponds to 0 and a second other wavelength corresponds to 1 resulting in an asymmetric binary system that is a special case of the N-nary system which is different from a binary system based on Boolean logic.

5. An architecture according to claim 2, wherein the family of N-nary logic gates includes:

an O-AND gate for providing a switching function from input signals $\lambda_i$ and $\lambda_j$ at the input ports X and Y, wherein $\lambda_i$ and $\lambda_j$ represents repectively one of the wavelengths within the N number of wavelengths, to an output signal $C_{out}$ according to the following table:

| X | Y | $C_{out}$ = X O-AND Y |
|---|---|---|
| 0 | 0 | 0 |
| 0 | $\lambda_j$ | 0 |
| $\lambda_i$ | 0 | 0 |
| $\lambda_i$ | $\lambda_j$ | $\lambda_i$. |

6. An architecture according to claim 2, wherein the family of N-nary logic gates includes:

an O-OR gate for providing a switching function from input signals $\lambda_i$ and $\lambda_j$ at the input ports X and Y, wherein $\lambda_i$ and $\lambda_j$ represents respectively one of the wavelengths within the N number of wavelengths, to an output signal $C_{out}$ according to the following table:

| X | Y | $C_{out}$ = X O-OR Y |
|---|---|---|
| ○ | ○ | ○ |
| ○ | $\lambda_i$ | $\lambda_i$ |
| $\lambda_i$ | ○ | ○ |
| $\lambda_i$ | $\lambda_i$ | ○. |

7. An architecture according to claim 2, wherein the family of N-nary logic gates includes:
an O-NOT gate for providing a switching function from input signal $\lambda_i$ at input port X, wherein $\lambda_i$ represents one of the wavelengths within the N number of wavelengths, to an output signal $C_{out}$ according to the following table:

| X | $C_{out}$ = O-NOT X |
|---|---|
| ○ | $\lambda_i$ |
| $\lambda_i$ | ○. |

8. An architecture according to claim 2, wherein the family of N-nary logic gates includes:
an O-NOR gate for providing a switching function from input signals $\lambda_i$ and $\lambda_i$ at the input ports X and Y, wherein $\lambda_i$ and $\lambda_i$ represents respectively one of the wavelengths within the N number of wavelengths, to an output signal $C_{out}$ according to the following table:

| X | Y | $C_{out}$ = X O-NOR Y |
|---|---|---|
| ○ | ○ | ○ |
| ○ | $\lambda_i$ | $\lambda_i$ |
| $\lambda_i$ | ○ | ○ |
| $\lambda_i$ | $\lambda_i$ | ○. |

9. An architecture according to claim 2, wherein the family of N-nary logic gates includes:
an N-nary O-NAND gate, having a similar switching function to the N-nary O-NOR;

| X | Y | $C_{out}$ = X O-NAND Y |
|---|---|---|
| ○ | ○ | ○ |
| ○ | $\lambda_i$ | ○ |
| $\lambda_i$ | 0 | $\lambda_i$ |
| $\lambda_i$ | $\lambda_i$ | ○. |

10. A system or device implementing the architecture of claim 1 for supporting all optical logic comprising:
an optical logic device operating on N different wavelengths to provide data processing, computing, switching, or any other functions in accordance with the N-valued digital logic system.

* * * * *